United States Patent
Kohdaka

[19]

[11] Patent Number: 6,046,607
[45] Date of Patent: *Apr. 4, 2000

[54] LOGIC CIRCUIT CONTROLLED BY A PLURALITY OF CLOCK SIGNALS

[75] Inventor: Takayuki Kohdaka, Shizuoka-ken, Japan

[73] Assignee: Yamaha Corporation, Hamamatsu, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/911,106

[22] Filed: Aug. 13, 1997

Related U.S. Application Data

[63] Continuation of application No. 08/556,199, Nov. 9, 1995, Pat. No. 5,670,899.

[30] Foreign Application Priority Data

Nov. 21, 1994 [JP] Japan ..................................... 6-311207
Nov. 21, 1994 [JP] Japan ..................................... 6-311209

[51] Int. Cl.[7] .......................... H03K 19/096; H03K 17/16
[52] U.S. Cl. ................................. 326/97; 326/93; 326/21; 327/295
[58] Field of Search ................................. 326/93, 96, 97, 326/21; 327/144, 295, 163, 297, 269, 258

[56] References Cited

U.S. PATENT DOCUMENTS

| | | |
|---|---|---|
| 3,619,642 | 11/1971 | Dunn . |
| 4,259,595 | 3/1981 | Omori . |
| 5,440,250 | 8/1995 | Albert . |
| 5,477,164 | 12/1995 | Denker . |
| 5,521,538 | 5/1996 | Dickinson . |
| 5,550,490 | 8/1996 | Durham et al. . |
| 5,565,798 | 10/1996 | Durham et al. . |

FOREIGN PATENT DOCUMENTS

| | | |
|---|---|---|
| 262113 | 3/1990 | Japan . |
| 2123826 | 5/1990 | Japan . |
| 4-219016 | 4/1992 | Japan . |
| 4207225 | 7/1992 | Japan . |
| 4219016 | 8/1992 | Japan . |
| 5-14157 | 5/1993 | Japan . |
| 6132806 | 5/1994 | Japan . |

*Primary Examiner*—Michael Tokar
*Assistant Examiner*—Richard Roseen
*Attorney, Agent, or Firm*—Pillsbury Madison & Sutro LLP

[57] ABSTRACT

A semiconductor integrated circuit has an integrally formed logic circuit that is controlled by clock signals. The semiconductor integrated circuit includes a clock signal delay device that generates a plurality of clock signals having phases that are shifted from each other by a small amount with respect to a reference clock signal. The logic circuit is divided into a plurality (N number) of circuit blocks so that each of the circuit blocks is controlled by each of the associated plurality of clock signals to reduce noises. Noises in a CMOS integrated circuit are also reduced by controlled reference clock signals. A CMOS integrated circuit includes at least one CMOS gate with an input terminal being commonly connected to gates of a PMOS transistor and an NMOS transistor, and a latch circuit for transmitting data to the input terminal of the CMOS gate by clock signal control. The CMOS gate is provided with an auxiliary PMOS transistor being inserted at the PMOS transistor side and an auxiliary NMOS transistor being inserted at the NMOS transistor side. A timing control circuit is provided that generates a control clock signal adapted to maintain the auxiliary PMOS transistor and the auxiliary NMOS transistor in an OFF state during a specified period of time during which an electric potential output of the CMOS gate varies.

12 Claims, 5 Drawing Sheets

LOGIC CIRCUIT CONTROLLED BY A PLURALITY OF CLOCK SIGNALS

This is a continuation of application Ser. No. 08/556,199, filed Nov. 9, 1995, now U.S. Pat. No. 5,670,899.

BACKGROUND OF THE INVENTION

1. Field of the Invention

The present invention generally relates to reduction of noises that may be generated within a semiconductor integrated circuit. More particularly, the present invention relates to a semiconductor integrated circuit including an integrally formed logic circuit that is controlled by clocks. The present invention also relates to a CMOS integrated circuit having a CMOS gate and a latch circuit that transfer data by means of clock control to an input terminal of the CMOS gate.

2. Description of Related Art

As miniaturization and high-integration of a circuit that operates in synchronism with a single phase clock continue to be pursued, semiconductor integrated circuits have suffered with the problem of large power-source noise caused by a large current that momentarily circulates in the circuit. For example, an increase in the potential on a grounding line (e.g., ground bounce) may be caused by the momentary circulation of a large current. This is a major source of circuit malfunction.

In conventional logic integrated circuits with a lower degree of miniaturization and integration, a large amount of current circulates in an output circuit unit thereof. resulting in a substantial amount of noise. Several attempts have been made to reduce the noise. For example, Japanese laid-open patent application HEI 4-219016 describes a method to reduce such a large current. According to this reference, where there are a plurality of output circuits that operate simultaneously, the output circuits are controlled with clocks having phases that are successively shifted by a small amount so that the operation current is time-wise distributed to reduce the power-source noise.

However, the above described method, which focuses on the output circuit, does not provide sufficient countermeasures to reduce the power-source noise for a much larger sized integrated circuit in which many internal logic circuits simultaneously operate. For example, as shown in TABLE 1 below, more countermeasures against the current noise on the internal circuits are required, than those on the output circuit unit, as higher integration continues to be pursued.

In TABLE 1, the current ratio between an internal gate and an output gate is assumed to be 1:40, and the current is indicated as a relative value between the current in the past and the current in the present. Also, it is assumed that ⅕–1/10 of the internal gates initially operate in synchronism with a clock signal.

Noises are also a problem in CMOS integrated circuits. For example, when the output potential from a CMOS inverter functioning as a CMOS gate changes from an "H" level to a "L" level, or from a "L" level to an "H" level, a PMOS transistor and an NMOS transistor are ON at the same time, and the feedthrough current is drawn from the power supply terminal to the grounding terminal. In particular, a CMOS circuit with a large current capacity that is used as, for example, an output buffer draws a large amount of feedthrough current, resulting in problems such as increased noise and increased power consumption.

To decrease the feedthrough current in a CMOS inverter, the gates may be controlled so that a PMOS transistor and an NMOS transistor do not turn ON at the same time. In this respect, various methods to control the gates have been described. for example, in Japanese Laid-open patent applications HEI 2-123826, HEI 4-207225 HEI 2-62113 and HEI 6-132806.

Japanese Laid-open Patent Applications HEI 2-123826, HEI 4-207225 and HEI 6-132806 describe methods in which gates of a PMOS transistor and an NMOS transistor in a CMOS inverter, that are normally commonly connected to an input terminal CMOS inverter, are separated and independently controlled. Namely, circuit elements such as a delay element and a switch element are inserted between the input gate and the gates of the PMOS transistor and the NMOS transistor. Since these circuit elements are inserted in the path for input signals of the CMOS inverter, where a plurality of CMOS inverters are provided, these circuit elements are required for each of the CMOS inverters in order to perform the same control at each of the CMOS inverters, resulting in a large number of elements and greater complexity.

According to Japanese Laid-open Patent Application HEI 2-62113, gates of a PMOS transistor and an NMOS transistor of a CMOS inverter are commonly connected to an input terminal of the CMOS inverter. A circuit element is inserted between a signal input terminal and each of the gates of the PMOS transistor and the NMOS transistor in order to shift the timing at which these transistors are turned

TABLE 1

|  | FEATURES IN THE PAST | FEATURES AS A RESULT OF HIGH INTEGRATION |
|---|---|---|
| BACKGROUND, SIZE OF INTEGRATION | 10,000 GATES | 200,000 GATES |
| CLOCK SYNCHRONIZED INTERNAL GATES | 1,000–2,000 GATES | 20,000–40,000 GATES |
| NUMBER OF INVERTERS AT OUTPUT UNIT | 50 | 200 |
| CURRENT BY INTERNAL GATES | (1,000–2,000) × 1 | (10,000–20,000) × 1 |
| CURRENT BY OUTPUT UNITS | 50 × 40* = 2,000 | 200 × 40* = 8,000 |
| CURRENT RATIO (INTERNAL: OUTPUT) | 1:2 – 1:1 | 5:2 – 5:1 |

*Current ratio between internal gate and output gate.

on. However, where there are a plurality of CMOS inverters, a feedthrough current protection circuit element is required for each of the CMOS inverters, and this is not shared with other CMOS inverters. As a result, while noises may be reduced, such a current protection circuit makes it difficult to implement higher integration of an integrated circuit due to the large number of circuit elements.

SUMMARY OF THE INVENTION

It is an object of an embodiment of the present invention to provide a semiconductor integrated circuit that effectively reduces noise.

It is another object of an embodiment of the present invention to provide a CMOS integrated circuit that substantially reduces feedthrough current, and yet facilitates higher integration.

In accordance with an embodiment of the present invention, a semiconductor integrated circuit has an integrally formed logic circuit that is controlled by clock signals The semiconductor integrated circuit includes a clock delay device that generates a plurality of clock signals having phases that are shifted from each other by a small amount with respect to a reference clock. The logic circuit is divided into a plurality (N number) of circuit blocks so that each of the circuit blocks is controlled by a corresponding one of the plurality of clock signals. As a result, an operation current for the plurality (N number) of circuit blocks, that could flow concurrently through the circuit is distributed. Accordingly, power supply noise (lowered potential on the power supply line, increased potential on the grounding line) is reduced to about one over Nth number of the divided circuit blocks.

In accordance with still another embodiment of the present invention, a CMOS integrated circuit includes at least one CMOS gate with an input terminal being commonly connected to gates of a PMOS transistor and an NMOS transistor, and a latch circuit for transmitting data to the input terminal of the CMOS gate by a clock control signal. The CMOS gate is provided with an auxiliary PMOS transistor being inserted at the PMOS transistor side and an auxiliary NMOS transistor being inserted at the NMOS transistor side. A timing control circuit is provided that generates a control clock adapted to maintain the auxiliary PMOS transistor and the auxiliary NMOS transistor in an OFF state during a specified period of time during which an electric potential output of the CMOS gate varies.

In accordance with a preferred embodiment of the present invention, the timing control circuit includes a first control clock generating circuit that generates a first control clock, for controlling a latch circuit, by delaying a reference clock signal by a specified period of time; and a second control clock generating circuit that generates a second control clock adapted to maintain the auxiliary PMOS transistor and the auxiliary NMOS transistor in an OFF state during a specified period of time during which an electric potential output of the CMOS gate varies. As a result, the auxiliary PMOS transistor and the auxiliary NMOS transistor are not activated in response to the reference clock signal.

As a result, the auxiliary PMOS transistor and the auxiliary NMOS transistor are turned off by a timing control circuit during the potential transition period in which feedthrough current can flow. Namely, the passage of feedthrough current through the CMOS gate is turned ON and OFF to control the feedthrough current. Furthermore, gates of CMOS transistors that form a CMOS gate are commonly connected to an input terminal in a normal manner. As a result, one timing control circuit is commonly provided for a plurality of CMOS gates. Accordingly, noise that is caused by a feedthrough current is substantially eliminated and yet the feedthrough current can be controlled at the CMOS gate without hampering higher integration of circuit devices.

Other features and advantages of the invention will be apparent from the following detailed description, taken in conjunction with the accompanying drawings which illustrate, by way of example, various features of embodiments of invention.

DETAILED DESCRIPTION OF PREFERRED EMBODIMENTS

Preferred embodiments of the present invention are hereunder described with reference to the accompanying drawings.

Figure 1:
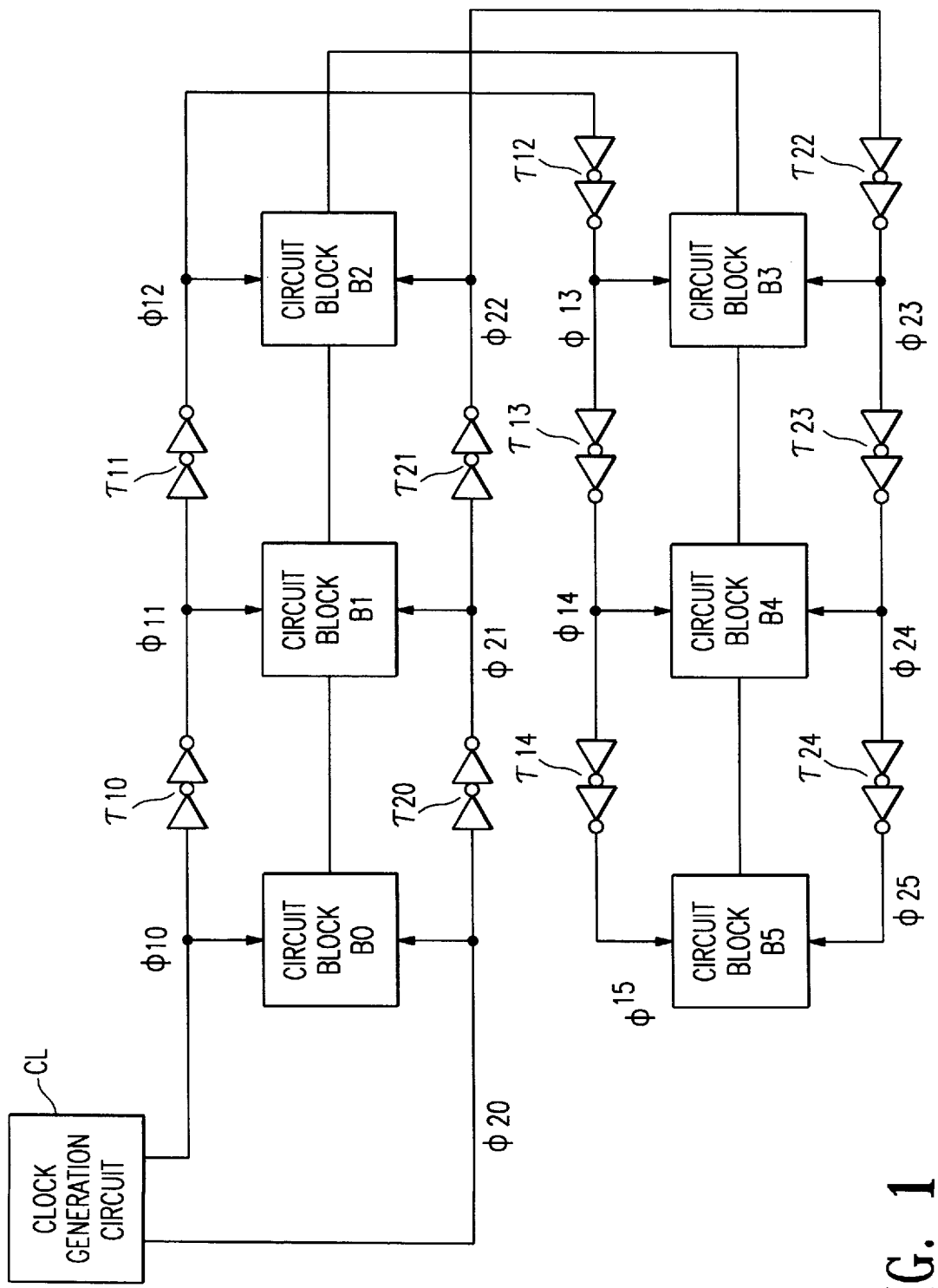
FIG. 1 shows a diagram of a semiconductor integrated circuit in accordance with an embodiment of the present invention.

FIG. 1 shows a block diagram of a logic integrated circuit in accordance with an embodiment of the present invention. The illustrated logic integrated circuit has about 200,000 gates in which 20,000–40,000 gates thereof operate in synchronism with a clock signal. There are about 50 output inverters, the current ratio between an internal gate and an output inverter is about 1:40, and the current ratio between all of the internal gates and all of the output inverters ranges between 5:2 and 5:1. However, in alternative embodiments, a different number of gates, output inverts or different ratios may be used.

In accordance with the embodiment shown in FIG. 1, an internal logic circuit on the chip is divided into six circuit blocks B0, B1, B2, B3, B4 and B5. A clock signal generation circuit CL generates 2different reference clock signals φ10 and φ20 that provide references for the operation of all the logic circuits. However, in alternative embodiments, a different number of blocks or clock signals may be used.

For example, one of the reference clock signals φ10 is used as a clock signal for transferring data to each circuit block from a block preceding thereto at the rise time of the reference clock signal. The other reference clock signal φ20 operates an internal logic circuit of each circuit block at the rise time of the reference clock signal based upon data transferred. Conventionally, these reference clock signals φ10 and φ20 are supplied at the same time to all the circuit blocks B0, B1, B2, B3, B4 and B5.

In accordance with an embodiment, the reference clock signals φ10 and φ20 are supplied to the respective circuit blocks B0, B1, B2, B3, B4 and B5 with their phases being slightly delayed. In a preferred embodiment, a delay circuit T10 delays the reference clock signal φ10 by a small amount to generate a clock signal φ11. Also, the clock signal φ11 is slightly delayed by a delay circuit T11 to generate a clock signal φ12. In a similar manner, clock signals are successively delayed by delay circuits T12, T13 and T14 to generate clock signals φ13, φ14 and φ15. The clock signals φ10, φ11, φ12, φ13, φ14 and φ15 are supplied to the circuit blocks B0, B1, B2, B3, B4 and B5, respectively, as clock signals to be used for transferring data.

In a similar manner, based upon the other reference clock signal φ20, clock signals are successively delayed by delay circuits T20, T21, T22, T23 and T24 to generate clock signals φ21, φ22, φ23, φ24 and φ25. The clock signals φ20, φ21, φ22, φ23, φ24 and φ25 are supplied to the, circuit blocks B0, B1, B2, B3, B4 and B5 as operation clock signals.

The above delay circuits T10 through T14 and T20 through T24 may be formed by inverter chains, for example, as shown in FIG. 1, and a delay time T is set to be sufficiently small to be substantially negligible with respect to the clock signal cycle. In alternative embodiments, other delay circuits may be used.

Figure 2A:
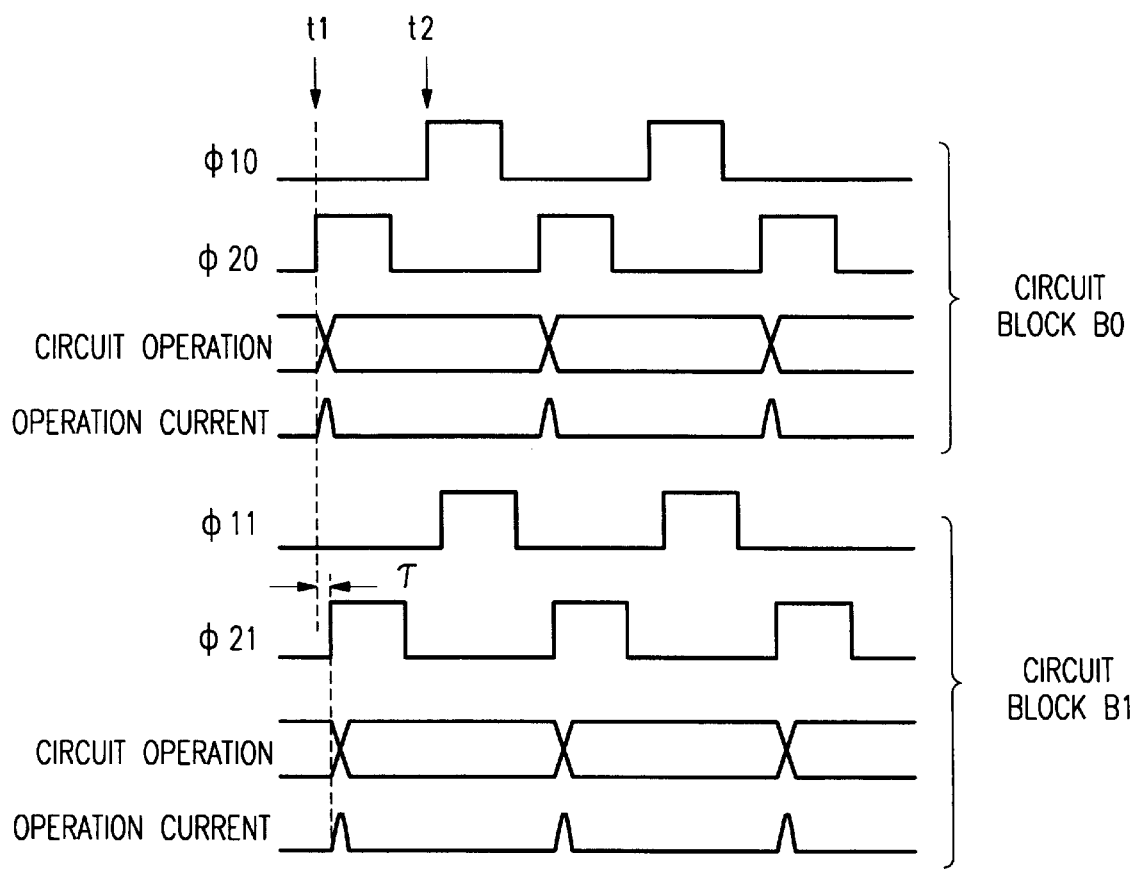
FIG. 2(a) shows an operation timing chart of the circuit shown in FIG. 1.

An operation of the logic integrated circuit composed in this manner will be described with reference to FIGS. 2(a) and 2(b). FIG. 2(a) shows operations of the two circuit blocks B0 and B1. As described above, the circuit block B0 starts operation at the rise time of the reference clock signal φ20, and the operating current flows through the circuit block B0 at the same timing. The operation of the circuit block B1 is started by the clock signal φ21 with a delay of T with respect to the circuit block B0 and the operating current flows therethrough as shown in FIG. 2(a).

The operation of the following circuit blocks are performed in a similar manner As a result, the operating current for the entire chip of a logic integrated circuit is timewise divided by the number of divided blocks forming the circuit as shown in FIG. 2 (b).

Figure 2B:
FIG. 2(b) shows the shape of an operation current generated by the circuit shown in FIG. 1.

As clearly shown in FIGS. 2(a) and 2(b), the delay time T is set to a small value so that the operation of all the circuit blocks B0–B5 is completed within a time period between the rise time t1 of the clock signal φ20 and the following rise time t2 of the clock signal φ10.

If outputs by the respective circuit blocks B0–B5 which resulted from the operations starting at the rise time t1 of the clock signal φ20 are desired to be output in parallel with each other, a latch circuit may be provided at each circuit block for transferring data at the rise time of the reference clock signal φ10.

Figure 2C:
FIG. 2(c) shows the shape of an operation current generated by a conventional circuit.

FIG. 2(c) shows an operating current by a conventional system which does not use the circuit block division. The peak current reaches a substantially higher level. In contrast, in accordance with an embodiment of the present invention, when a chip internal logic circuit is equally divided into, for example, six blocks, the peak operating current lowers to about ⅙ of the peak value that may be generated by the conventional system.

As described above, in a large scale logic integrated circuit in which current in an internal logic circuit is several times larger than that of an output circuit, the current distribution at only the output circuit does not achieve an effective noise and transient current level reduction. However, as shown in the embodiment above, the current distribution process performed within the internal logic circuit achieves reduction of power-source noise and transient current levels.

As a result, in accordance with an embodiment of the present invention, a semiconductor integrated circuit with divided circuit blocks of an internal logic circuit has a substantially reduced power-source noise as compared with a semiconductor integrated circuit in which current is simultaneously applied to the entire internal logic circuit at once.

Figure 3:
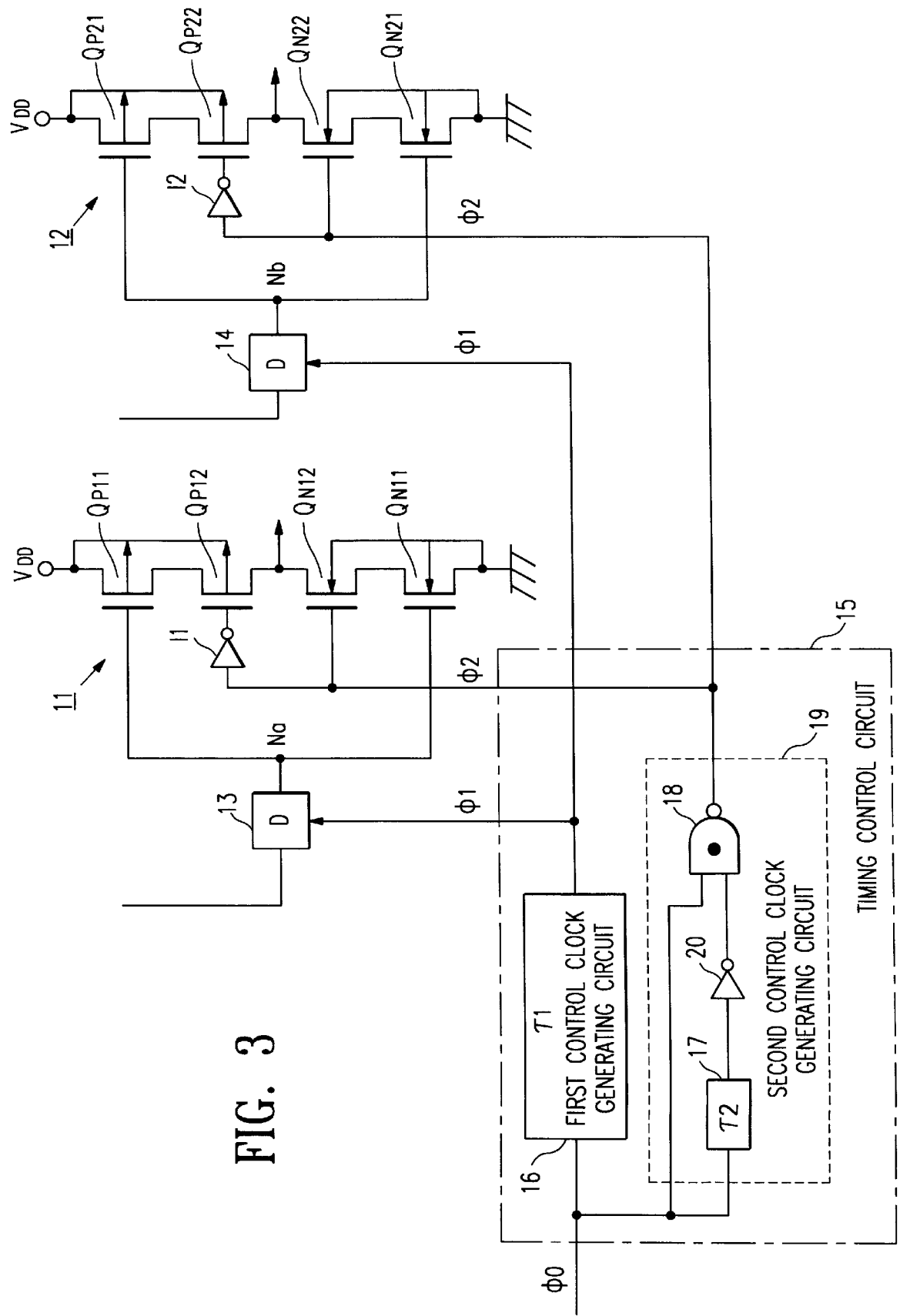
FIG. 3 shows a diagram of a CMOS integrated circuit in accordance with an embodiment of the present invention.

FIG. 3 shows a CMOS integrated circuit in accordance with another embodiment of the present invention. The CMOS integrated circuit has two CMOS inverters 11 and 12. The CMOS inverter 11 has a PMOS transistor QP11 and an NMOS transistor QN11 as its main components. Gates of the PMOS transistor QP11 the NMOS transistor QN11 are commonly connected to an input terminal Na. An auxiliary PMOS transistor QP12 is inserted between an output terminal and the PMOS transistor QPt1, and an auxiliary NMOS transistor QN12 is inserted between the output terminal and the NMOS transistor QN11.

In a similar manner, the other CMOS inverter 12 also has a PMOS transistor QP21 and an NMOS transistor QN21. Gates of the PMOS transistor QP21 and the NMOS transistor QN21 are commonly connected to an input terminal Nb. An auxiliary PMOS transistor QP22 is inserted between an output terminal and the PMOS transistor QP21, and an auxiliary NMOS transistor QN22 is inserted between the output terminal and the NMOS transistor QN21.

Data is transferred to the input terminals Na and Nb of the respective CMOS inverters 11 and 12 through latch circuits 13 and 14 that are controlled by clock signals To control the data transfer to the CMOS inverters 11 and 12 and to control the feedthrough current of each of the CMOS inverters 11 and 12, there is provided a timing control circuit 15 that is commonly used by the CMOS inverters 11 and 12.

The timing control circuit 15 includes a first control clock signal generating circuit 16 that generates a first controlling clock signal φ1 based upon a reference clock signal φ0 for controlling the latch circuits 13 and 14, and a second control clock signal generating circuit 19 that generates a second controlling clock signal φ2 based upon the reference clock signal φ0 for controlling the feedthrough current. The first control clock signal generating circuit 16 is a delay circuit that delays the reference clock signal φ0 by a delay amount of T1. The second control clock signal generating circuit 19 includes a delay circuit 17 that delays the reference clock signal φ0 by a delay amount of T2, an inverter 20 and a NAND gate 18. A delayed and inverted output and the reference clock signal φ0 are inputted in the NAND gate 18, where T1 is smaller than T2 (T1<T2).

The second control clock signal φ2 provided by the second control clock signal generating circuit 19 is a clock signal that takes on an "L" level from the rise of the reference clock signal φ0 until the delayed time T2 provided by the delay circuit 17 has elapsed. The second control clock signal φ2 is directly supplied to gates of the auxiliary NMOS transistors QN12 and QN22 of the respective CMOS inverters 11 and 12. Also the second control clock signal φ2 is inverted by inverters I1 and I2 and then supplied to gates of the auxiliary PMOS transistors QP12 and QP22 of the CMOS inverters 11 and 12, respectively.

Figure 4:
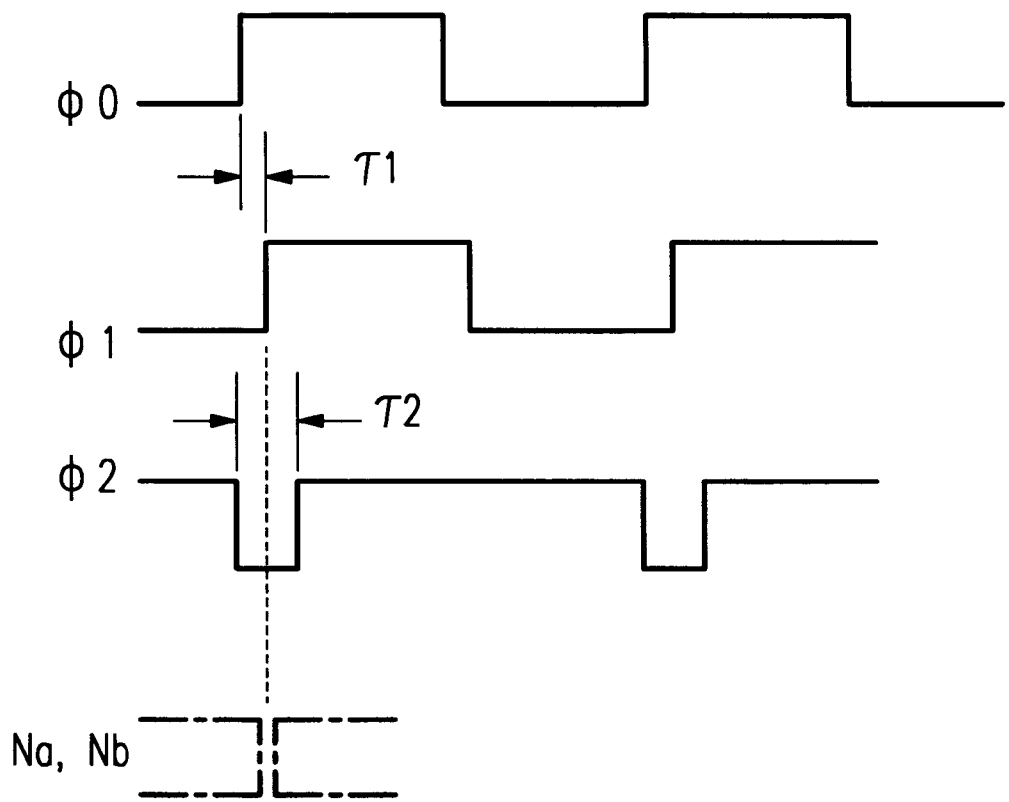
FIG. 4 shows an operation timing chart of the CMOS integrated circuit shown in FIG. 3.

Operation of the CMOS circuit with the above described structure will be described with reference to FIG. 4. The first control clock signal φ1 has the delay T1 with respect to the reference clock signal φ0 and is provided to the latch circuits 13 and 14 so that data retained at the latch circuits 13 and 14 is transferred to input terminals Na and Nb of the CMOS inverter. Due to the transfer of data, the potential at the input terminals Na and Nb changes and the CMOS inverters 11 and 12 are driven.

On the other hand, the second control clock signal φ2 takes on the level "L" for the time period of T2 while the potential at the input terminals Na and Nb changes. While the second control clock signal φ2 is at the level "L", the auxiliary PMOS transistors QP12 and QP22, and the auxiliary NMOS transistors QN12 and QN22 in the CMOS inverters 11 and 12 are maintained at OFF state.

The operation will be described with respect to the CMOS inverter 11.

A time duration T2 is set for the second control clock signal φ2 to take on the level "L" so that the set time duration covers the potential transition period during which the main transistors QP11 and QN11 simultaneously become "ON" state. Thus, feedthrough current does not flow through the CMOS inverter 11 during the time period T2. When either the PMOS transistor QP11 or the NMOS transistor QN11 sufficiently reaches the "OFF" state, the auxiliary PMOS transistor QP12 and the auxiliary NMOS transistor QN12 turn "ON", and the CMOS inverter 11 allows load to be charged or discharged in a manner like an ordinary CMOS inverter performs.

The CMOS inverter 12 performs an operation similar to the operation of the CMOS inverter 11. A time duration T2 is set for the second control clock signal φ2 to take on the level "L" so that the set time duration covers the potential transition period during which the main transistors QP21 and QN21 simultaneously become "ON" state. Thus, feedthrough current does not flow through the CMOS inverter 12 during the time period T2. When either the PMOS transistor QP21 or the NMOS transistor QN21 sufficiently reaches the "OFF" state, the auxiliary PMOS transistor QP22 and the auxiliary NMOS transistor QN22 turn "ON", and the CMOS inverter 12 allows load to be charged or discharged in a manner like an ordinary CMOS inverter performs.

In accordance with the embodiment described above, since the path of feedthrough current in the CMOS inverter is turned ON and OFF, the feedthrough current is restricted during the transition period in which the potential of output data varies. According to the above-described embodiment, only one common timing control circuit need be provided for many CMOS inverters. As a result, the power consumption of the CMOS integrated circuit and the reduction of noise are achieved without hampering higher circuit integration.

Figure 5:
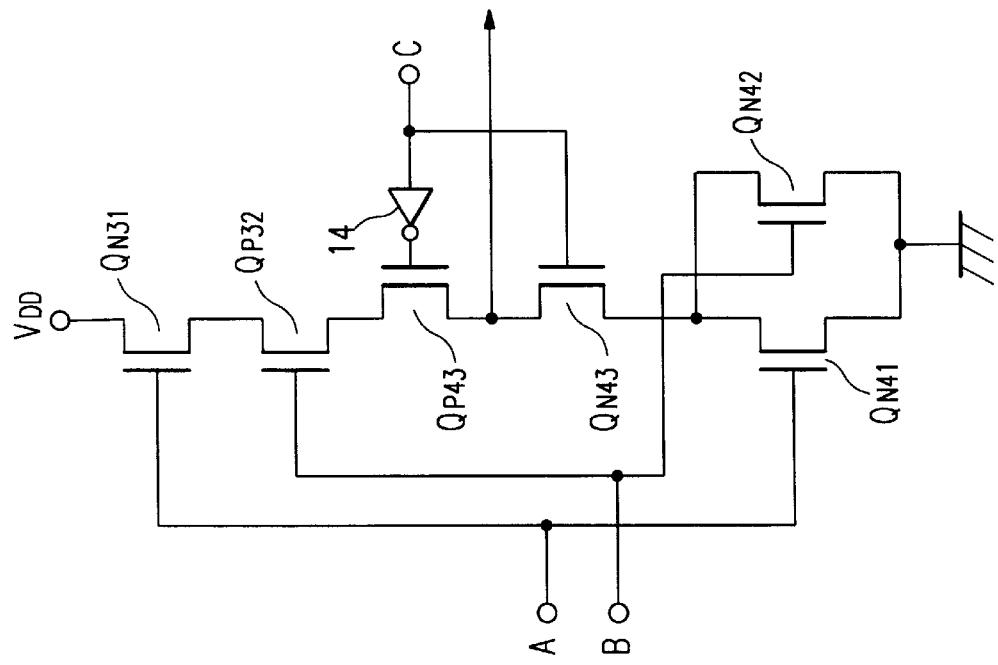
FIG. 5 shows a diagram of a NAND gate in accordance with an embodiment of the present invention.

The present invention is applicable not only to an inverter, but also to a NAND gate or a NOR gate in a manner similar to that described above. FIG. 5 shows a two-input NAND gate in accordance with an embodiment of the present invention. The NAND gate is formed by two PMOS transistors QP 31 and QP 32 provided in parallel with each other at the side of a power source VDD, and two NMOS transistors QN 31 and QN 32 provided in series at the ground side. Gates of PMOS transistors QP 31 and QP 32 are connected to input terminals A and B, respectively, and gates of NMOS transistors QN 31 and QN 32 are connected to the same input terminals A and B, respectively.

An auxiliary PMOS transistor QP33 is inserted at the drain side of the PMOS transistor QP 31 and QP 32, and an auxiliary NMOS transistor QN33 is inserted at the drain side of the NMOS transistor QN 31. A control terminal C is coupled to a gate of the auxiliary PMOS transistor QP 33 through an inverter I 3, and is directly connected to a gate of the auxiliary NMOS transistor QN 33.

Figure 6:
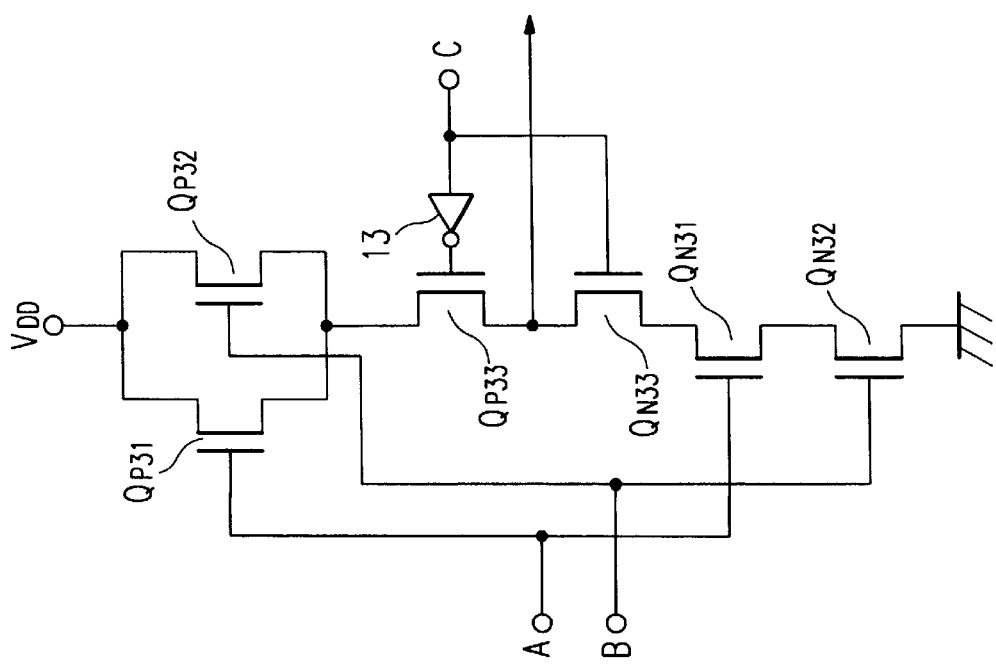
FIG. 6 shows a NOR gate in accordance with an embodiment of the present invention.

FIG. 6 shows a two-input NOR gate in accordance with another embodiment of the present invention. The NOR gate includes two PMOS transistors QP 41 and QP 42 provided in series at the side of a power source VDD, and two NMOS transistors QN 41 and QN 42 provided in parallel with each other at the ground side. Gates of the PMOS transistors QP 41 and QP 42 are connected to input terminals A and B, respectively, and gates of the NMOS transistors QN 41 and QN 42 are connected to the same input terminals A and B, respectively. An auxiliary PMOS transistor QP43 is inserted at the drain side of the PMOS transistor QP 42, and an auxiliary NMOS transistor QN43 is inserted at the drain side of the NMOS transistors QN 41 and QN 42. A control terminal C is coupled to a gate of the auxiliary PMOS transistor QP 43 through an inverter I 4, and is directly connected to a gate of the auxiliary NMOS transistor QN 43.

In accordance with the embodiments shown in FIG. 5 and FIG. 6, the auxiliary PMOS transistor and the auxiliary NMOS transistor are controlled in synchronism with the transition of the output in a manner similar to that of the embodiment described with reference to FIG. 3.

The present invention is not limited to the above described embodiments. For example, in the above described embodiments, to restrain the feedthrough current, an auxiliary PMOS transistor and an auxiliary NMOS transistor are inserted at the drain side, namely at the output terminal side, of a main PMOS transistor and a main NMOS transistor, respectively. However, an auxiliary PMOS transistor and an auxiliary NMOS transistor may be inserted at the source side. Also, one of the auxiliary PMOS transistor or the auxiliary NMOS transistor may be omitted to restrain the feedthrough current.

As described above, in accordance with the present invention, the feedthrough current is restricted at the time during which output data is in transition in a current. In accordance with the present invention, a circuit element is not inserted in an input signal path of a CMOS gate, and one common timing control circuit can be provided for many CMOS gates. As a result, high circuit integration of a CMOS integrated circuit is facilitated.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor integrated circuit, which is disposed in a semiconductor chip, comprising:

a clock signal delay device that is disposed within the semiconductor chip and generates a plurality of clock signals, each clock signal having a phase that is shifted by a small amount with respect to the other of the plurality of clock signals; and a plurality of circuit blocks collectively defining an integrated logic circuit, wherein each of the circuit blocks is capable of transferring and receiving data, is coupled to at least one neighboring circuit block, and is controlled by one of the plurality of clock signals, the amount of phase shift between any two of the plurality of clock signals that control a transferring circuit block and a corresponding receiving circuit block is small enough to cause the two clock signals to overlap, and the phase shift of the clock signals is along a data transfer path defined by successive transferring and receiving circuit blocks.

2. The semiconductor integrated circuit according to claim 1, wherein the clock signal delay device includes a reference clock signal generation circuit for generating a reference clock signal and a plurality of serially connected delay circuits for generating a plurality of successively-delayed clock signals, and the amount of delay between any two of the delayed clock signals is small enough to be substantially negligible with respect to a period of the reference clock signal so that the two delayed clock signals overlap.

3. The semiconductor integrated circuit according to claim 1, wherein the clock signal delay device generates at least three clock signals, all of which overlap with one another.

4. The semiconductor integrated circuit according to claim 1, wherein the amount of phase shift between any two of the clock signals that control any two of the circuit blocks is small enough to be substantially negligible with respect to a period of the clock signal.

5. A semiconductor integrated circuit, which is disposed in a semiconductor chip, comprising:

a reference clock signal generation circuit that is disposed within the semiconductor chip and generates at least one reference clock signal;

a clock signal delay device that successively delays the at least one reference clock signal to generate a plurality of delayed clock signals, each of the delayed clock signals having a phase that is shifted by a specified amount with respect to the other of the plurality of delayed clock signals; and a plurality of circuit blocks collectively defining an integrated logic circuit to be controlled by the plurality of delayed clock signals, wherein each of the circuit blocks is capable of receiving and transferring data, is coupled to at least one neighboring circuit block, and is controlled by one of the plurality of delayed clock signals, the amount of phase shift between any two of the plurality of delayed clock signals that control a transferring circuit block and a corresponding receiving circuit block is small enough to be substantially negligible with respect to a period of the reference clock signal so that the two delayed clock signals overlap, and the phase shift of the delayed clock signals is along a data transfer path defined by successive transferring and receiving circuit blocks.

6. The semiconductor integrated circuit according to claim 5, wherein the clock signal delay device includes a plurality of delay circuits serially connected to one another.

7. A semiconductor integrated circuit according to claim 5, wherein the clock signal delay device includes a plurality of inverter chains serially connected to one another.

8. The semiconductor integrated circuit according to claim 5, wherein the reference clock signal generation circuit generates a first reference clock signal adapted for transferring data from one circuit block to a next circuit block and a second reference clock signal adapted for operating each of the plurality of circuit blocks.

9. The semiconductor integrated circuit according to claim 5, wherein the clock signal delay device generates at least three delayed clock signals, all of which overlap with the reference clock signal.

10. A method of operating a semiconductor integrated circuit disposed in a semiconductor chip and having a logic circuit, the method comprising:

dividing the logic circuit into N (N≧2) circuit blocks, each of which is capable of transferring and receiving data;

connecting each of the circuit blocks to at least one neighboring circuit block;

generating at least one reference clock signal from a reference clock signal generator disposed within the semiconductor chip;

successively delaying the at least one reference clock signal to generate a plurality of delayed clock signals;

controlling each of at least one of the circuit blocks by one of the plurality of delayed clock signals; and controlling the phase shift of the delayed clock signals along a data transfer path defined by successive transferring and receiving circuit blocks, wherein the amount of the phase shift between any two of the plurality of delayed clock signals that control a transferring circuit block and corresponding receiving circuit block is a specified amount small enough to cause the two delayed clock signals to overlap.

11. The method according to claim 8, wherein the step of successively delaying the at least one reference clock signal includes generating at least three delayed clock signals, all of which overlap with the reference clock signal.

12. The method according to claim 10, wherein the amount of phase shift between any two adjacent delayed clock signals is small enough to be substantially negligible with respect to a period of the reference clock signal.

* * * * *